United States Patent
Kang (10) Patent No.: US 7,499,346 B2
(45) Date of Patent: Mar. 3, 2009

(54) HIGH VOLTAGE GENERATING DEVICE OF SEMICONDUCTOR DEVICE

(75) Inventor: Young Su Kang, Yongin-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 86 days.

(21) Appl. No.: 11/617,635

(22) Filed: Dec. 28, 2006

(65) Prior Publication Data

US 2008/0080287 A1 Apr. 3, 2008

(30) Foreign Application Priority Data

Sep. 29, 2006 (KR) .................. 10-2006-0096175

(51) Int. Cl.
G11C 5/14 (2006.01)
G11C 11/34 (2006.01)
G11C 16/06 (2006.01)
G11C 7/06 (2006.01)
G11C 8/00 (2006.01)

(52) U.S. Cl. .............................. 365/189.09; 365/185.18; 365/185.2; 365/185.21; 365/189.07; 365/233.1

(58) Field of Classification Search ............ 365/185.18, 365/185.2, 185.21, 189.07, 189.09, 233.1
See application file for complete search history.

(56) References Cited

U.S. PATENT DOCUMENTS 6,128,242 A * 10/2000 Banba et al. ................ 365/226
6,194,954 B1 2/2001 Kim et al.
7,149,132 B2 * 12/2006 Bedeschi et al. ....... 365/189.11
2007/0085597 A1 * 4/2007 Okada et al. ................ 327/536

FOREIGN PATENT DOCUMENTS

| KR | 100264959 B1 | 6/2000 |
| KR | 1020000061230 A | 10/2000 |
| KR | 1020020057052 A | 7/2002 |

* cited by examiner

*Primary Examiner*—Ly D Pham
(74) *Attorney, Agent, or Firm*—Townsend and Townsend and Crew LLP (57) ABSTRACT

A high voltage generator of a semiconductor device includes a first high voltage pump unit, a second high voltage pump unit, and a clock signal generating unit. The first high voltage pump unit compares a first high voltage and a first reference voltage to generate a first enable signal, and performs a pumping operation in response to the first enable signal and a first clock signal to generate the first high voltage. The second high voltage pump unit compares a second high voltage and a second reference voltage to generate a second enable signal, and performs a pumping operation in response to the second enable signal and a second clock signal to generate the second high voltage. The clock signal generating unit generates the first clock signal or the second clock signal in response to the first enable signal and the second enable signal when at least one of the first enable signal and the second enable signal is enabled.

7 Claims, 6 Drawing Sheets

HIGH VOLTAGE GENERATING DEVICE OF SEMICONDUCTOR DEVICE

CROSS-REFERENCES TO RELATED APPLICATIONS

The present application claims priority to Korean patent application number 10-2006-96175, filed on Sep. 29, 2006, which is incorporated by reference in its entirety.

BACKGROUND OF THE INVENTION

The present invention relates to semiconductor devices and, more particularly, to a high voltage generator in a semiconductor device, which can reduce the operating current during an active operation.

In general, the power supply of a semiconductor memory device can be classified into external power or internal power.

The external power would include Vext (external voltage), Vss (ground voltage), Vref (input reference voltage), VextQ (quiet external voltage) and so on. The internal power would include Vpp (word line enable voltage), Vbb (cell array bulk bias voltage), Vint (internal operating voltage) and the like.

Meanwhile, a cell block within most DRAM is designed to have one transistor and one cell capacitor coupled to each other. The cell transistor generally employs NMOS transistors due to their advantages in area and current driving ability. In order to read and write a logic high data from and into the cell, a voltage higher than the voltage of the data is applied to the gate of the cell transistor. The voltage for driving the cell transistor is usually called "high voltage Vpp".

Figure 1:
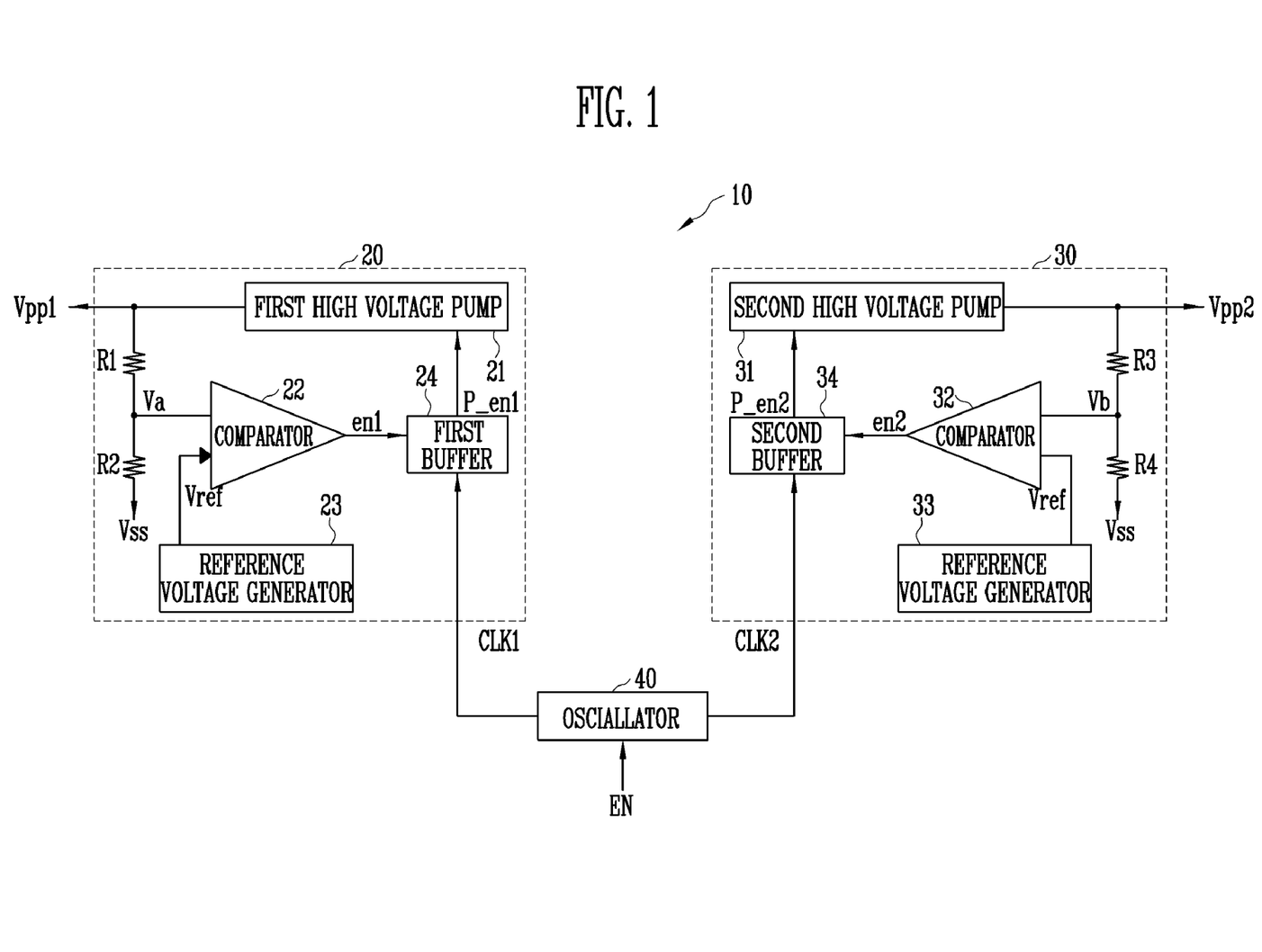
FIG. 1 is a circuit diagram of a high voltage generator of a conventional semiconductor device.

FIG. 1 is a circuit diagram of a conventional high voltage generator in a semiconductor device.

Referring to FIG. 1, the high voltage generator 10 of the semiconductor device includes a first high voltage pump unit 20, a second high voltage pump unit 30 and an oscillator 40.

The operation of the high voltage generator 10 of the semiconductor device is described by showing the generation of a first high voltage Vpp1 in an example below.

If an enable signal EN is activated according to timing stored in ROM in the semiconductor device, the oscillator 40 is enabled and generates the clock signals CLK1 and CLK2.

The high voltage Vpp1 output from the first high voltage pump unit 20 is divided by resistors R1 and R2. A comparator 22 compares a divided voltage Va, and a reference voltage Vref generated from a reference voltage generator 23, and generates a buffer enable signal en1.

A first buffer 24 is activated in response to the buffer enable signal en1, and outputs a pump enable signal P-en1 synchronized with the clock signal CLK1.

A first high voltage pump 21 boosts the high voltage Vpp1 to a specific voltage level in response to the pump enable signal P-en1.

Figure 2:
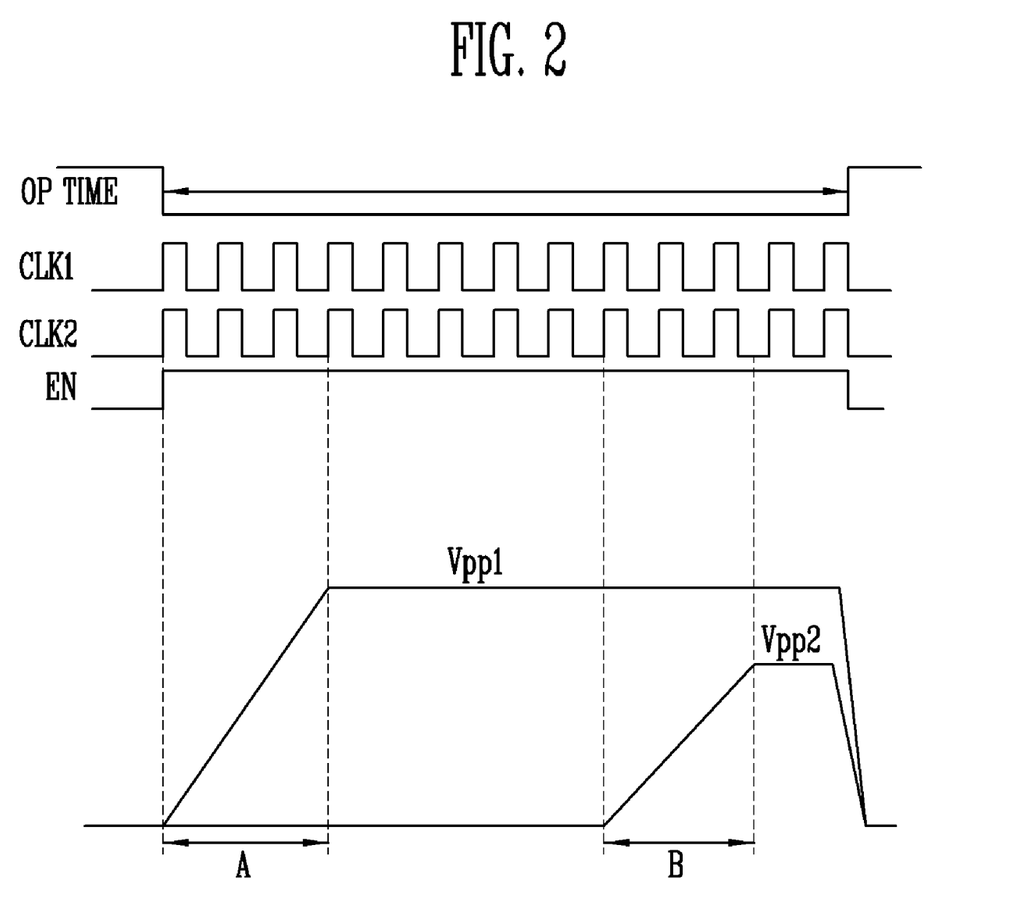
FIG. 2 shows several signal waveforms for illustrating the operation of FIG. 1.

FIG. 2 shows several waveform signals for illustrating the operation of FIG. 1.

Referring to FIG. 2, the high voltage generating device 10 of the semiconductor device continues to generate the clock signals CLK1 and CLK2 during an active operating time OP TIME of the device. The generated clock signals CLK1 and CLK2 are transferred to the high voltage pump units 20 and 30, and take part in the pumping operation. However, time at which the high voltage pump units 20 and 30 operate substantially is not a total active operating time OP TIME, but is an initial time of each operating mode, that is, an initial pumping time A of a program operation or an initial pumping time B of a read operation. Thus, the oscillator 40 is unnecessarily enabled during the active operating time OP TIME to generate the clock signals CLK1 and CLK2, so that power is wasted.

BRIEF SUMMARY OF THE INVENTION

The present invention is directed at a high voltage generator of a semiconductor device, which can reduce the current for operating the oscillator during the active operating time at which the pumping operation is not performed, in such a manner that the oscillator is controlled using the enable signal to enable a high voltage pump so that the oscillator generates the clock signal only while one or more of the high voltage pumps perform the pumping operation during the active operating time of the device.

In one embodiment, a high voltage generator of a semiconductor device includes a first high voltage pump unit, a second high voltage pump unit, and a clock signal generating unit. The first high voltage pump unit compares a first high voltage and a first reference voltage to generate a first enable signal, and performs a pumping operation in response to the first enable signal and a first clock signal to generate the first high voltage. The second high voltage pump unit compares a second high voltage and a second reference voltage to generate a second enable signal, and performs a pumping operation in response to the second enable signal and a second clock signal to generate the second high voltage. The clock signal generating unit generates the first clock signal or the second clock signal in response to the first enable signal and the second enable signal when at least one of the first enable signal and the second enable signal is enabled.

In another embodiment, a high voltage generator of a semiconductor device includes a plurality of high voltage pump units, and a clock signal generating unit. The plurality of high voltage pump units compare one of a plurality of high voltages and a reference voltage to generate one of a plurality of enable signals, and perform a pumping operation in response to one of the plurality of enable signals and a clock signal to generate one of the plurality of high voltages. The clock signal generating unit encodes the plurality of enable signals. If at least one of the enable signals is enabled, the clock signal generating unit generates the clock signal, and if all of the enable signals are enabled, the clock signal generating unit is disabled.

In still another embodiment, a high voltage generating device of a semiconductor device includes a first high voltage pump unit, a second high voltage pump unit, and a clock generating unit. The first high voltage pump unit generates a first high voltage in response to a first clock signal generated according to an oscillator enable signal output from a clock encoder. The second high voltage pump unit generates a second high voltage in response to a second clock signal generated according to the oscillator enable signal. The clock generating unit compares an output voltage of the first high voltage pump unit and a reference voltage, compares a first enable signal according to the comparison result, an output voltage of the second high voltage pump unit, and the reference voltage, and generates the first clock signal and the second clock signal in response to a second enable signal according to the comparison result. The clock generating unit is comprised of the clock encoder and oscillator. The clock encoder is for encoding the first enable signal, encoding the second enable signal and generating the oscillator enable signal. The oscillator is for generating the first clock signal and the second clock signal according to the oscillator enable signal.

DESCRIPTION OF SPECIFIC EMBODIMENTS

Specific embodiments according to the present patent will be described with reference to the accompanying drawings.

Figure 3:
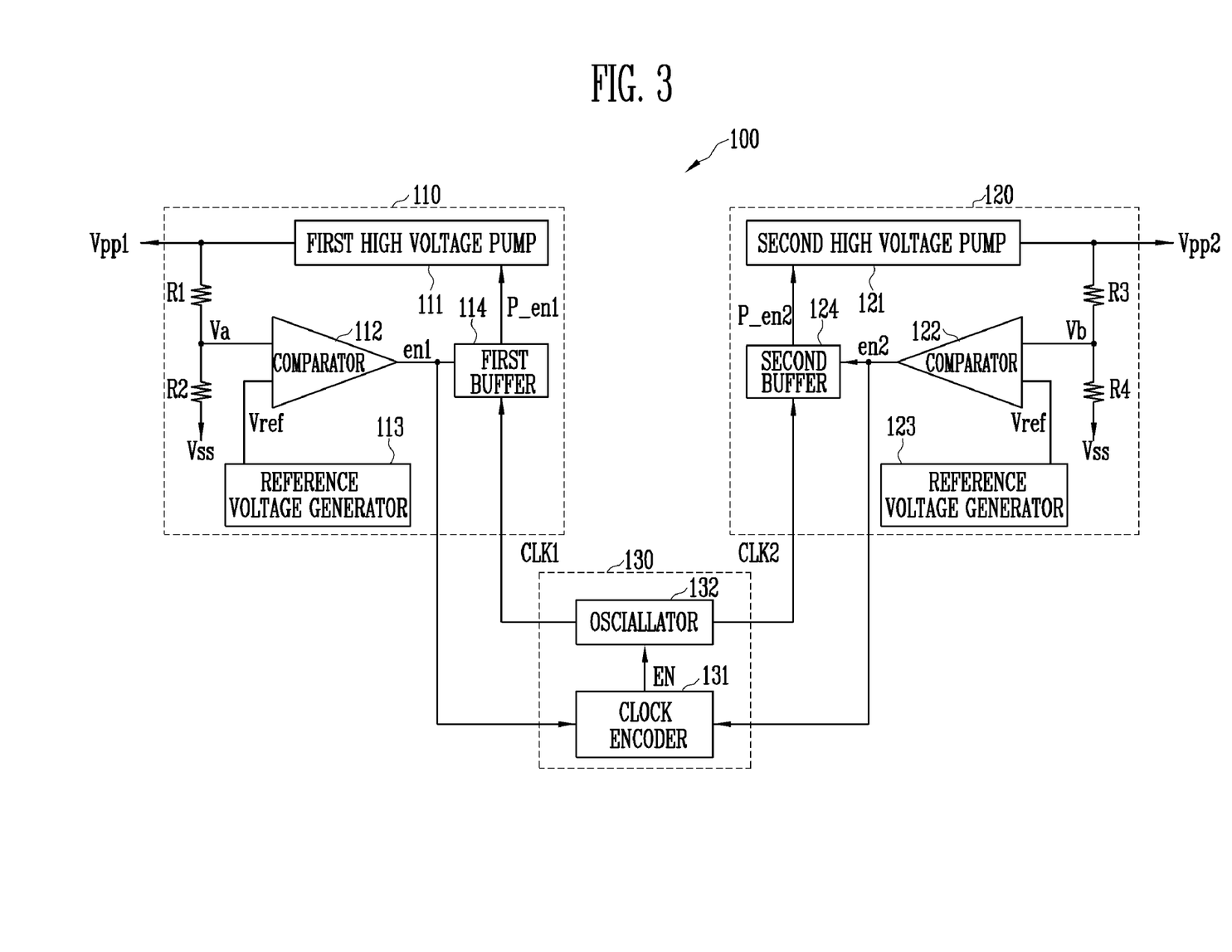
FIG. 3 is a circuit diagram of a high voltage generator of a semiconductor device according to an embodiment of the present invention.

FIG. 3 is a circuit diagram of a high voltage generator of a semiconductor device according to an embodiment of the present invention.

Referring to FIG. 3, a high voltage generator 100 includes a first high voltage pump unit 110, a second high voltage pump unit 120 and a clock generating unit 130. A plurality of high voltage pump units can be used to generate a plurality of different high voltages, but for the present embodiment, a case where the high voltage generating device 100 includes the two high voltage pump units 110 and 120 is described as an example.

The first high voltage pump unit 110 includes a first high voltage pump 111, a comparator 112, a reference voltage generator 113, a first buffer 114 and resistors R1 and R2.

The resistors R1 and R2 are connected in series between a first high voltage Vpp1 and a ground voltage Vss. The first high voltage Vpp1 is divided according to resistance values of the resistors R1 and R2 to generate a divided voltage Va.

The comparator 112 compares the divided voltage Va, and a reference voltage Vref output from the reference voltage generator 113. When the divided voltage Va is lower than the reference voltage Vref, the comparator 112 outputs a buffer enable signal en1 as a high level.

The first buffer 114 is activated in response to the buffer enable signal en1, and outputs a pump enable signal P_en1 synchronized with a first clock signal CLK1 output from the clock generating unit 130.

The first high voltage pump 111 performs a pumping operation in response to the pump enable signal P_en1, and generates the first high voltage Vpp1.

The second high voltage pump unit 120 has similar construction and operation as that of the first high voltage pump unit 110, and will not be described in detail for simplicity.

The clock generating unit 130 includes a clock encoder 131 and an oscillator 132. The clock encoder 131 encodes the buffer enable signals en1 and en2 generated from the first high voltage pump unit 110 and the second high voltage pump unit 120, respectively, and generates an oscillator enable signal EN. The oscillator 132 generates the clock signals CLK1 and CLK2 in response to the oscillator enable signal EN.

Figure 4A:
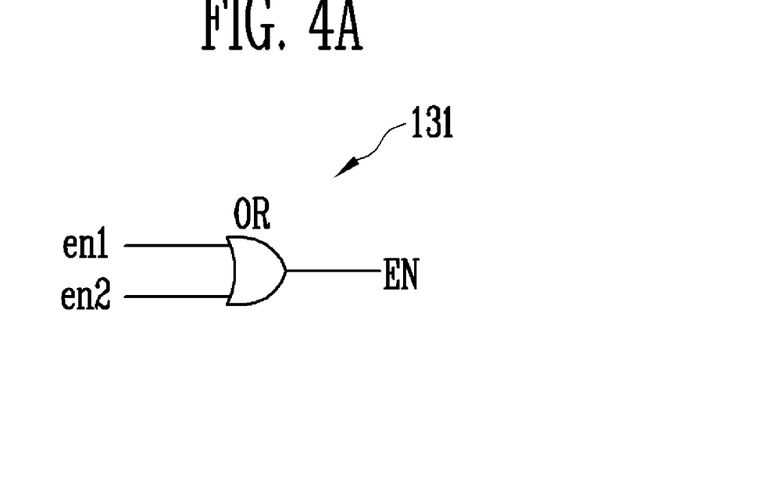
FIGS. 4a and 4b are detailed circuit diagrams of a clock encoder shown in FIG. 3.

FIG. 4a is a detailed circuit diagram of the clock encoder 131 shown in FIG. 3.

Referring to FIG. 4a, the clock encoder 131 may be implemented using an OR gate. The OR gate logically combines the buffer enable signals en1 and en2, and outputs the oscillator enable signal EN.

Figure 4B:
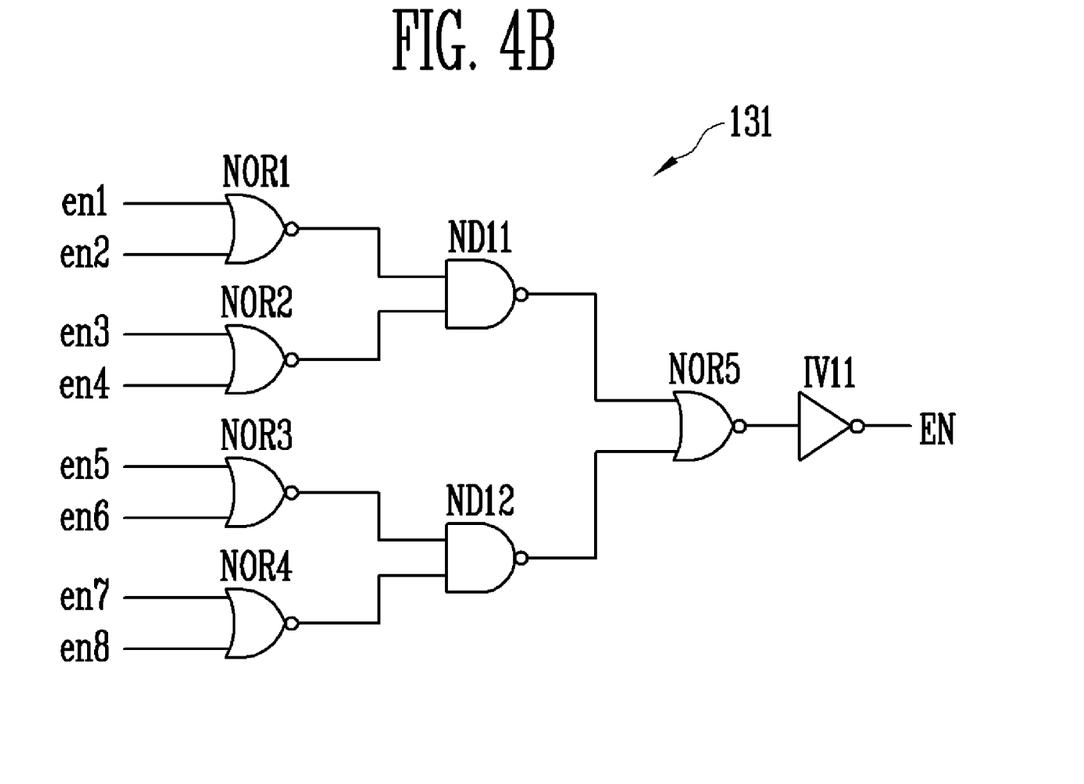

FIG. 4b is a detailed circuit diagram of the clock encoder 131, which is used in a high voltage generator having three or more high voltage pumps.

Referring to FIG. 4b, the clock encoder 131 includes a plurality of NOR gates NOR1 to NOR5, NAND gates ND11 and ND12, and an inverter IV11. The two-input NOR gates NOR1 to NOR4 logically combine a plurality of buffer enable signals en1 to en8, respectively, and output four combination signals. The two input NAND gates ND11 and ND12 logically combine the four combination signals from the NOR gates NOR1 to NOR4, respectively, and output two combination signals. The NOR gate NOR5 logically combines the two combination signals output from the NAND gates ND11 and ND12, and outputs a combination signal. The inverter IV11 inverts the output signal of the NOR gate NOR5, and outputs the oscillator enable signal EN.

Figure 5:
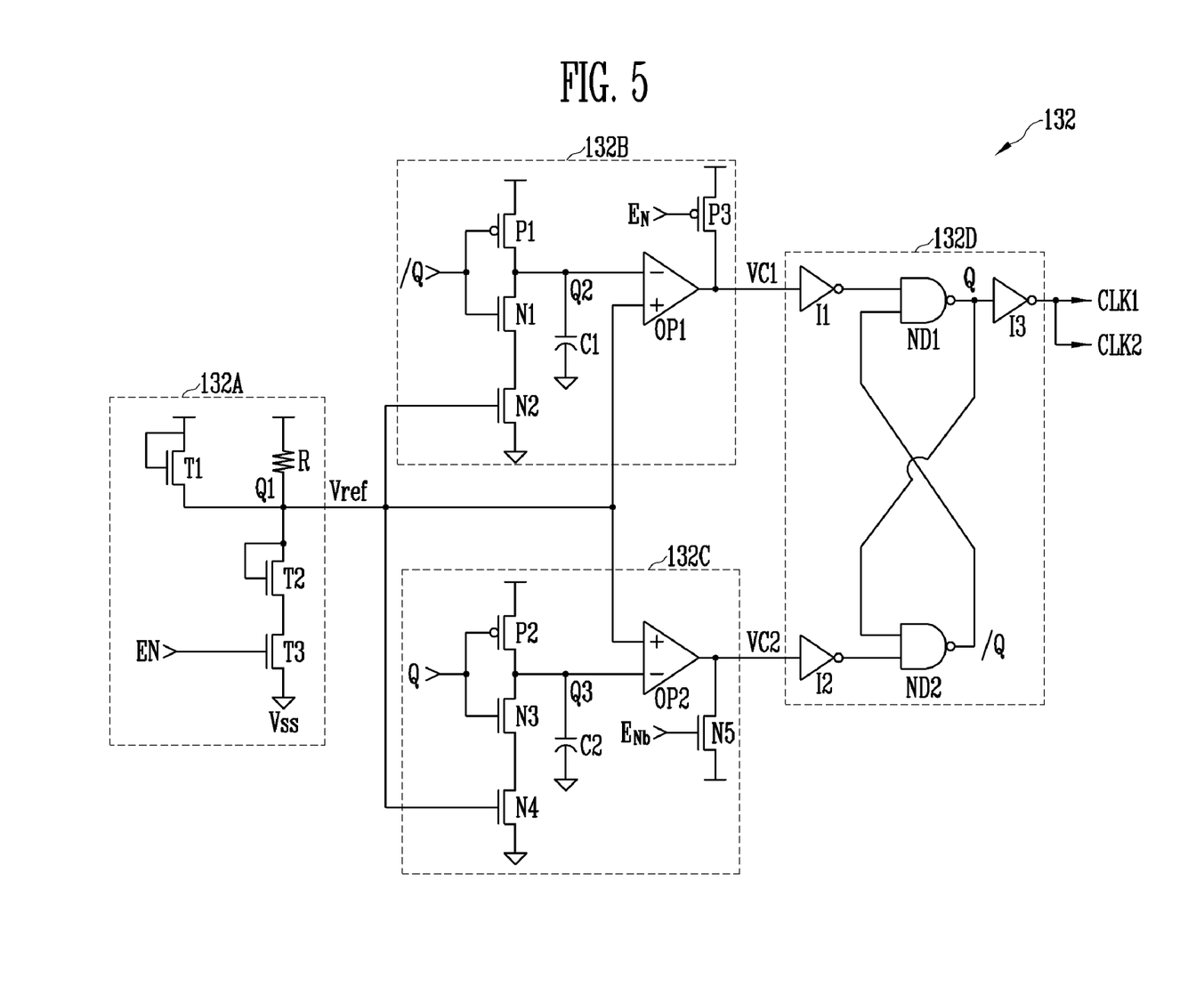
FIG. 5 is a detailed circuit diagram of the oscillator 132 shown in FIG. 3.

FIG. 5 is a detailed circuit diagram of the oscillator 132 shown in FIG. 3.

Referring to FIG. 5, the oscillator 132 includes a reference voltage generating unit 132A, a first control voltage generating unit 132B, a second control voltage generating unit 132C, and a SR latch unit 132D.

The reference voltage generating unit 132A includes first to third transistors T1 to T3 and a resistor R. The first transistor T1 is connected between a power supply voltage and an output node Q1, and transmits the power supply voltage to the output node Q1. The resistor R is connected between the power supply voltage and the output node Q1. The second and third transistors T2 and T3 are connected in series between the output node Q1 and a ground voltage, and are driven according to the signals of the output node Q1 (i.e., the reference voltage Vref and the osciallator enable signal EN). The reference voltage generating unit 132A divides the power supply voltage according to resistance values of the resistor R and the second transistor T2, and outputs the reference voltage Vref. The first to third transistors T1 to T3 employ a NMOS transistor.

The first control voltage generating unit 132B is driven according to the enable signal EN, and outputs a first control voltage VC1 according to an inverted input signal /Q and the reference voltage Vref. The first control voltage VC1 decides the cycle of a clock.

The first control voltage generating unit 132B includes a first PMOS transistor P1, a first NMOS transistor N1, a second NMOS transistor N2, a first capacitor C1, an OP amp OP1, and a third PMOS transistor. The first PMOS transistor P1 is connected between the power supply voltage and a node Q2 and driven according to the inverted input signal /Q. The first NMOS transistor N1 is connected to the node Q2 and driven according to the inverted input signal /Q. The second NMOS transistor N2 is connected between the first NMOS transistor N1 and a ground voltage and driven according to the reference voltage Vref. The first capacitor C1 is connected between the second node Q2 and the ground voltage. The OP amp OP1 has a negative terminal to which the voltage of the second node Q2 is input and a positive terminal to which the reference voltage Vref is input and generates the first control voltage VC1. The third PMOS transistor P3 is connected between the power supply voltage and the output terminal of the OP amp OP1 and driven according to the enable signal EN.

The second control voltage generating unit 132C is driven according to the enable signal EN, and transmits a second control voltage VC2 to decide the cycle of a clock according to an input signal Q and the reference voltage Vref.

The second control voltage generating unit 132C includes a second PMOS transistor P2, a third NMOS transistor N3, a fourth NMOS transistor N4, a second capacitor C2, an OP amp OP2, and a fifth NMOS transistor N5. The second PMOS transistor P2 is connected between the power supply voltage and a node Q3 and driven according to the input signal Q. The third NMOS transistor N3 is connected to the node Q3 and driven according to the input signal Q. The fourth NMOS transistor N4 is connected between the third NMOS transistor N3 and the ground voltage and driven according to the reference voltage Vref. The second capacitor C2 is connected between the node Q3 and the ground voltage. The OP amp OP2 has a negative terminal to which the voltage of the node Q3 is input and a positive terminal to which the reference voltage Vref is input and generates the second control voltage VC2. The fifth NMOS transistor N5 is connected between the power supply voltage and an output terminal of the OP amp OP2 and driven according to an inverted enable signal $E_{Nb}$.

The SR latch unit 132D generates the clock signals CLK1 and CLK2 according to the first and second control voltages VC1 and VC2.

The SR latch unit 132D includes a first inverter I1 for inverting the first control voltage VC1, a second inverter I2 for inverting the second control voltage VC2, first and second NAND gates ND1 and ND2, which are connected to form a latch, and a third inverter I3 for inverting the output of the first NAND gate ND1.

Figure 6:
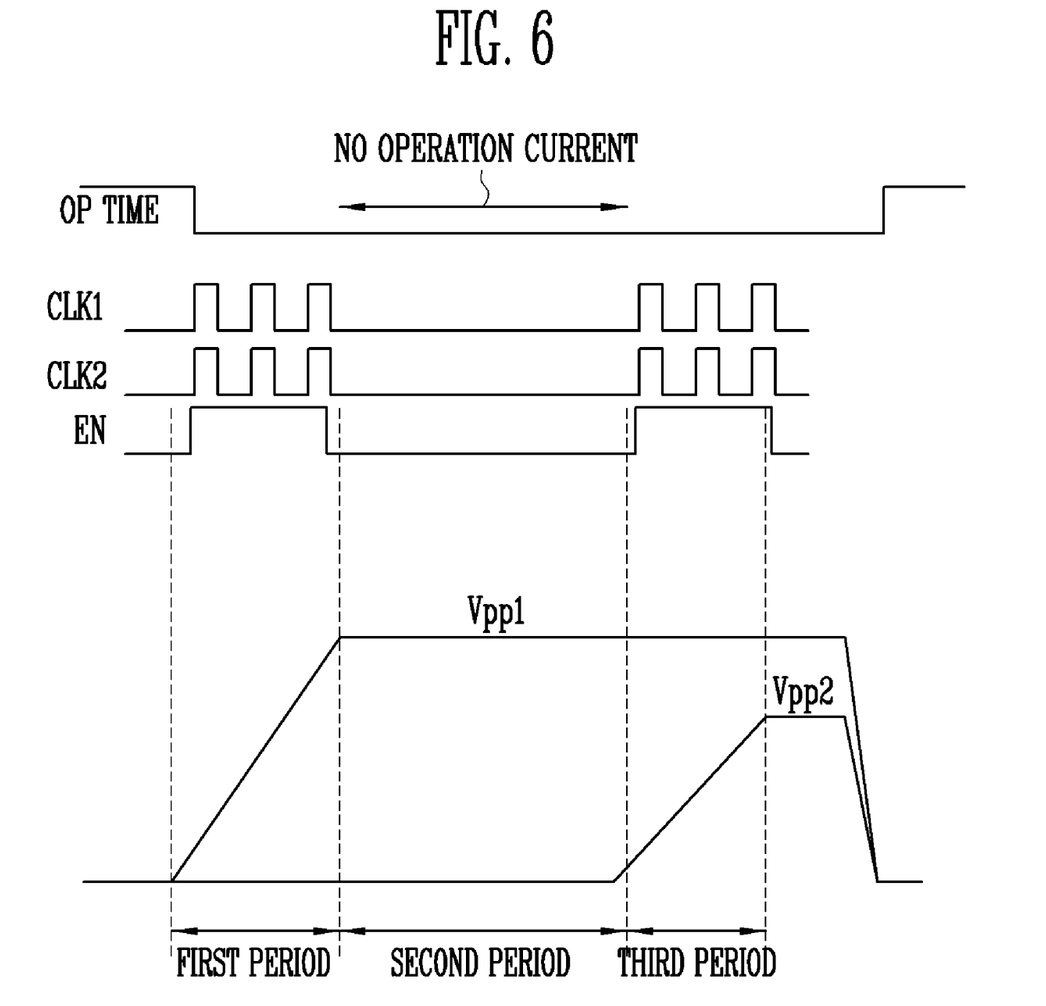
FIG. 6 illustrates a waveform of signals for illustrating the operation of FIG. 3.

FIG. 6 illustrates a waveform of signals for illustrating the operation of FIG. 3.

The operation of the high voltage generating device of the semiconductor device according to an embodiment of the present invention is described below in detail with reference to FIG. 6.

1) First Period

The resistors R1 and R2 of the first high voltage pump unit 110 divide the first high voltage Vpp1, which is lower than a desired voltage, and generates the divided voltage Va. The comparator 112 compares the divided voltage Va and the reference voltage Vref from the reference voltage generator 113, and generates the buffer enable signal en1 as a high level.

The resistors R3 and R4 of the second high voltage pump unit 120 divide the second high voltage Vpp2, and generate the divided voltage Vb. The comparator 122 compares the divided voltage Vb and the reference voltage Vref from the reference voltage generator 123, and generates the buffer enable signal en2 as a low level.

The clock encoder 131 encodes the buffer enable signal en1 and the buffer enable signal en2, and outputs the oscillator enable signal EN as a high level.

The reference voltage generating unit 132A of the oscillator 132 divides the power supply voltage according to the resistance values of the resistor R and the transistor T2 in response to the oscillator enable signal EN, and generates the reference voltage Vref.

The channels of the second and fourth NMOS transistors N2 and N4 within the first and second control voltages generating units 132B and 132C are changed according to the gate voltage Vgate, so that the amount of current drained to the ground can be reduced. Furthermore, considering delay incurred by the first and second capacitors C1 and C2, the falling time of inverter P1, N1 is significantly increased longer than its rising time, and the falling time of inverter P2, N3 is significantly increased longer than its rising time.

At this time, if the voltage of the node Q2 and the node Q3 within the first and second control voltage generating units 132B and 132C fall below the reference voltage Vref, it is again inverted and input to the SR latch unit 132D. The output of the SR latch unit 132D is inverted at a falling edge of one of the first and second control voltages VC1 and VC2 and is then fed back to the other terminal. Therefore, the clock signals CLK1 and CLK2 are output. Their cycle has been decided by the delay time of the second and fourth NMOS transistors N2 and N4 and the first and second capacitors C1 and C2 is output.

The first buffer 114 is enabled in response to the clock signal CLK1 and the buffer enable signal en1, and outputs the pump enable signal P_en1. The first high voltage pump 111 performs the pumping operation in response to the pump enable signal P_en1, and generates the first high voltage Vpp1 at a specific level.

2) Second Period

The divided voltage Va is raised by the first high voltage Vpp1 that is boosted up to a specific level. Accordingly, the buffer enable signal en1 output from the comparator 113 is disabled to a low level.

The clock encoder 131 outputs the oscillator enable signal EN as a low level in response to the buffer enable signal en1 of a low level and the buffer enable signal en2 of a low level. Accordingly, the operation of the oscillator 132 is inactivated, thus stopping the clock generating operation. Consequently, current consumption for generating the clocks CLK1 and CLK2 is stopped.

3) Third Period

The pumping operation of the second high voltage pump unit 120 is carried out in the same manner as the pumping operation of the first high voltage pump unit 110.

The second high voltage pump unit 120 compares the reference voltage Vref and the divided voltage Vb of the second high voltage Vpp2, and generates the buffer enable signal en2 as a high level.

The clock encoder 131 generates the oscillator enable signal EN as a high level in response to the buffer enable signal en1 of a low level and the buffer enable signal en2 of a high level.

The oscillator 132 outputs the clock signal CLK2 having a constant cycle in response to the oscillator enable signal EN.

The second buffer 124 of the second high voltage pump unit 120 generates the pump enable signal P_en2 in response to the buffer enable signal en2 of a high level and the clock signal CLK2. The second high voltage pump 121 performs the pumping operation in response to the pump enable signal P_en2, and generates the second high voltage Vpp2 to a specific level.

As described above, according to the present invention, the oscillator is controlled to generate a clock signal only while one or more of a plurality of high voltage pumps perform the pumping operation during the active operating time of a device, by using an enable signal to enable a high voltage pump. Accordingly, the current for operating the oscillator can be reduced during the active operating time at which the pumping operation is not performed.

The above embodiments of the present invention are illustrative and various alternatives are possible. Other additions, subtractions, or modifications are obvious in view of the present disclosure and are intended to fall within the scope of the appended claims.

What is claimed is:

1. A high voltage generator of a semiconductor device, comprising:

a first high voltage pump unit to compare a first high voltage and a first reference voltage and generate a first enable signal, and perform a pumping operation in response to the first enable signal and a first clock signal to generate the first high voltage;

a second high voltage pump unit to compare a second high voltage and a second reference voltage and generate a second enable signal, and perform a pumping operation in response to the second enable signal and a second clock signal to generate the second high voltage; and a clock signal generating unit to generate the first clock signal or the second clock signal in response to the first enable signal and the second enable signal when at least one of the first enable signal and the second enable signal is enabled.

2. The high voltage generator of claim 1, wherein the first high voltage pump unit comprises:

a high voltage pump to perform the pumping operation to generate the first high voltage;

a resistor unit to divide the first high voltage to generate a divided voltage;

a comparator to compare the divided voltage and the reference voltage to generate the first enable signal; and a buffer to generate a pump enable signal in response to the first enable signal and the first clock signal.

3. The high voltage generator of claim 2, wherein the second high voltage pump unit comprises:

a high voltage pump to generate the second high voltage;

a resistor unit to divide the second high voltage to generate a divided voltage;

a comparator to compare the divided voltage and the reference voltage to generate the second enable signal; and a buffer to generate a pump enable signal in response to the second enable signal and the second clock signal.

4. The high voltage generator of claim 1, wherein the clock signal generating unit comprises:

a clock encoder to generate an oscillator enable signal in response to the first enable signal and the second enable signal; and an oscillator to generate the first clock signal or the second clock signal in response to the oscillator enable signal.

5. The high voltage generator of claim 4, wherein the clock encoder outputs the oscillator enable signal of a high level when at least one of the first enable signal and the second enable signal is enabled.

6. The high generator device of claim 4, wherein the clock encoder includes an OR gate.

7. The high voltage generator of claim 4, wherein the oscillator comprises:

a control voltage generator to generate a control voltage in response to the oscillator enable signal;

a first control voltage generating unit to transmit a first control voltage to decide a cycle of a clock according to an inverted input signal and the control voltage in response to the oscillator enable signal;

a second control voltage generating unit to transmit a second control voltage to decide a cycle of a clock according to an input signal and the control voltage in response to the oscillator enable signal; and a SR latch unit to generate the first or second clock signal according to the first and second control voltages.

* * * * *